United States Patent [19]

Brymer et al.

[11] 3,860,835

[45] Jan. 14, 1975

[54] ANTI-COMPROMISE MICROELECTRONIC CIRCUIT

[75] Inventors: Barbara J. Brymer, San Antonio, Tex.; Edward J. Kapp; Frank Z. Keister, both of San Pedro, Calif.

[73] Assignee: The United States of America as represented by the Secretary of the Navy, Washington, D.C.

[22] Filed: Feb. 10, 1971

[21] Appl. No.: 114,344

[52] U.S. Cl. .................................... 307/298, 357/4

[51] Int. Cl. ........................................ H03k 19/168

[58] Field of Search ................. 307/298; 109/1, 36; 174/68.5

[56] References Cited

UNITED STATES PATENTS 3,394,218 7/1968 Foudriat ........................... 174/68.5

*Primary Examiner*—Maynard R. Wilbur
*Assistant Examiner*—N. Moskowitz
*Attorney, Agent, or Firm*—R. S. Sciascia; P. S. Collignon

[57] ABSTRACT

A thin film microelectronic anti-compromise or destructible circuit module having a palladium-aluminum-palladium thin film conducting sandwich vacuum deposited on a microelectronic substrate over which an electrical insulating material and microelectronic circuits are thin film deposited, in that order, with the destructive film sandwich coupled to a voltage pulse source to optionally energize the sandwich to destroy the microelectronic circuits by eutectic reaction.

9 Claims, 5 Drawing Figures

Steps 1,2a and 3.
Metal mask positive for steps 1,2a and 3. Clear strips represent area where first palladium is deposited followed by aluminum and second layer of palladium.

Step 2b.
Positive for metal mask through which aluminum is deposited in clear area to form connecting conductors between strips and pad areas for bonding external leads to anticompromise circuitry.

Step 4.
Negative for metal mask through which silicone monoxide is deposited.

Step 5.
Negative for metal mask through which nichrome resistance layer is deposited.

Step 6.
Negative for photomask used in etching process to produce nichrome resistive network.

Step 7
Positive for metal mask to deposit chromium-gold over aluminum and nichrome pad areas.

INVENTORS
BARBARA J. BRYMER
EDWARD J. KAPP
FRANK Z. KEISTER

BY H. H. Losche
ATTORNEY

Steps 1, 2a and 3.
Metal mask positive for steps 1, 2a and 3. Clear strips represent area where first palladium is deposited followed by aluminum and second layer of palladium.

Step 2b.
Positive for metal mask through which aluminum is deposited in clear area to form connecting conductors between strips and pad areas for bonding external leads to anticompromise circuitry.

Step 4.
Negative for metal mask through which silicone monoxide is deposited.

Step 5.
Negative for metal mask through which nichrome resistance layer is deposited.

Step 6.
Negative for photomask used in etching process to produce nichrome resistive network.

Step 7.
Positive for metal mask to deposit chromium-gold over aluminum and nichrome pad areas.

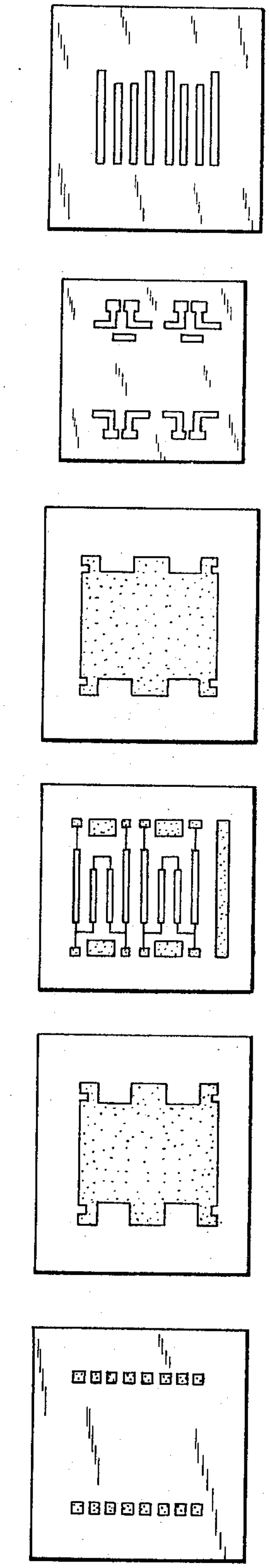

FIG. 5

ANTI-COMPROMISE MICROELECTRONIC CIRCUIT

BACKGROUND OF THE INVENTION

This invention relates to anti-compromise thin film microelectronic circuits and more particularly to the method of producing, and the structure of, thin film modules with destructive thin films thereon to produce a eutectic reaction on the microelectronic circuit to render it useless and unrecognizable if it is to fall into enemy hands.

In the prior known anti-compromise circuits pyrotechnic packages or explosive packages are placed in the vicinity of, or adjacent to, the circuitry to be destroyed. The most advanced known destructive circuit board used an oxidant layer under the thin film circuit which was ignited by a small pyrotechnic package at the edge or corner of the board. The first known type charred the circuit boards and separated the circuits therefrom but did not always melt or destroy the circuit beyond recognition. Both the first and second types required bulky pyrotechnic packages in areas of circuit module encasement where space was not available. In these known anti-compromise or destructive circuits the thin film circuit to be destroyed was not always destroyed beyond reconstruction, and certainly the most vital or strategic parts of the circuit were not destroyed.

SUMMARY OF THE INVENTION

In the present invention a glass, ceramic, or other suitable substrate has the destructive conductive films and the circuit films vacuum deposited thereon. Palladium is first film vacuum deposited on the substrate after which thin film layers of aluminum and again palladium are vacuum deposited on top of the first film of palladium to provide a sandwiched layer of conductive destructive film. An electrical insulating layer of thin film material is then vacuum deposited over the destructive sandwich film. The thin film circuitry is then deposited on top of the insulative film. If the thin film circuitry is to be resistance, the thin film can be deposited to the desired resistance and the circuit etched or photo-etched to the pattern and for the terminals desired. Chrominum and gold terminal pads are vacuum deposited at terminal points on the aluminum and resistance films to which leads of Kovar or gold wire may be attached by soldering or welding. These steps of construction provide a thin film circuit module with a palladium-aluminum-palladium conductive destructive film capable of destroying the thin film circuitry beyond recognition or repair when a pulsed or voltage surge is applied across the aluminum film of the destructive film sandwich. It is accordingly a general object of this invention to provide a destructible thin film module by a method of vacuum depositing thin film layers of pyrotechnic or eutectic reaction materials with an oxidant capable of destroying a thin film circuit at strategic or important points by the application of an electrical surge of current to the destructive film to destroy all these strategic parts of the thin film circuitry beyond all recognition or reconstruction.

BRIEF DESCRIPTION OF THE DRAWING

These and other objects and the attendant advantages, features and uses will become more apparent to those skilled in the art as a more detailed description proceeds when considered along with the accompanying drawings, in which:

FIG. 5 sets forth views of the steps of applying the various thin films to the substrate.

DESCRIPTION OF THE PREFERRED EMBODIMENT

Figure 1:
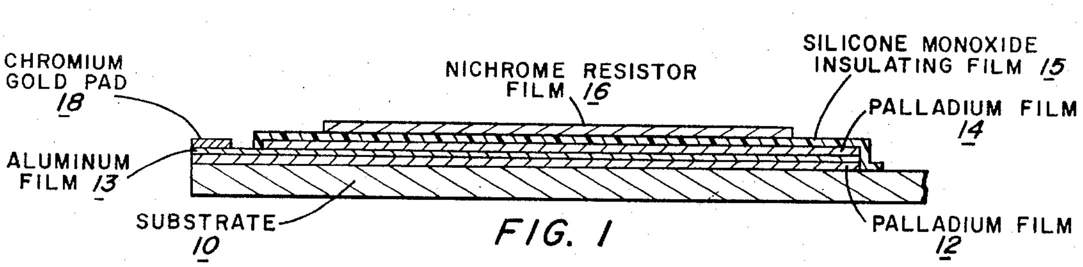
FIG. 1 is a cross-sectional view of a microelectronic circuit substrate with a destructive conductor film, a resistance film, and a circuit film thereon.
Figure 2:
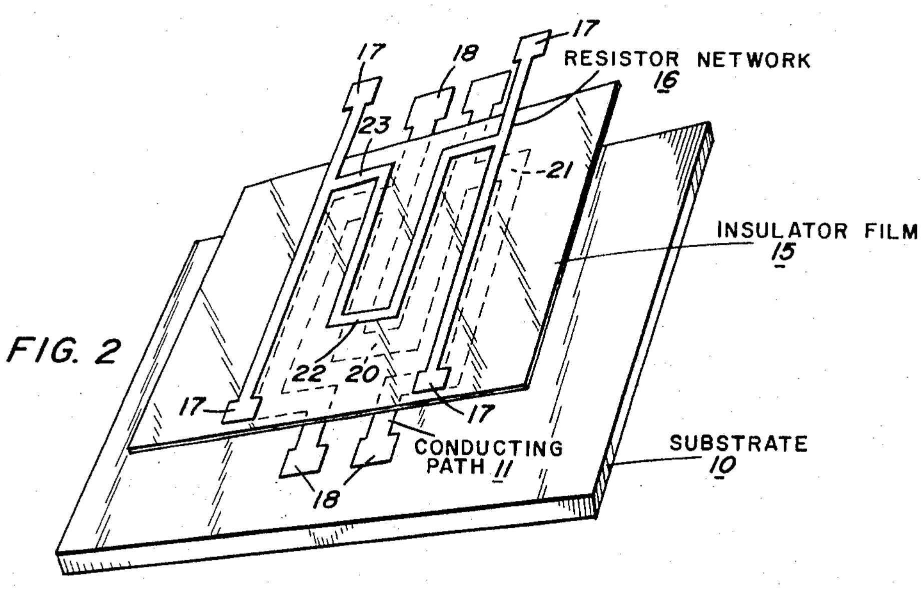
FIG. 2 is an isometric view of the substrate and thin films thereon.
Figure 3:
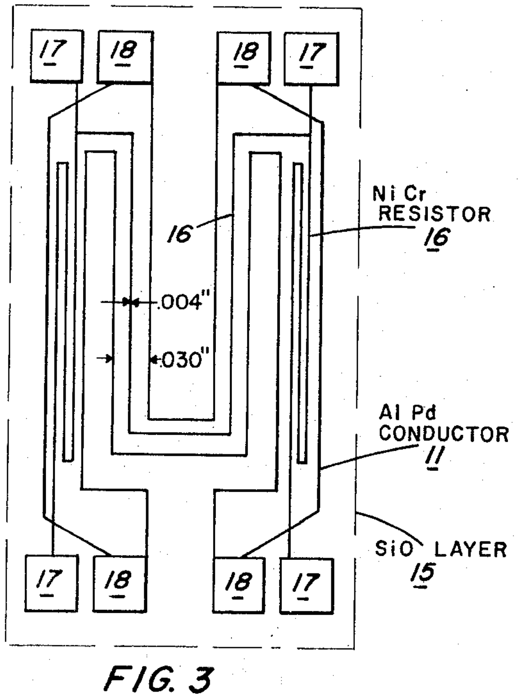
FIG. 3 is a circuit illustration and detail of the thin film circuit on the substrate shown in FIGS. 1 and 2.

Referring more particularly to FIGS. 1, 2, and 3 a glass or ceramic substrate is illustrated as the part 10 constituting the base or substrate for the destructive conductor and thin film circuits. By the vacuum deposition processes a conducting film sandwich, as shown by 11 in FIG. 2, is made up of three films 12, 13, and 14. The thin film first vacuum deposited on the substrate 10 is a palladium material to a depth of about 3,400 angstroms. Vacuum deposited on top of the palladium film is a layer of aluminum 13 about 7,000 angstroms thick completely overlaying the first palladium film and with terminal ends. A second palladium film 14 is vacuum deposited on top of the aluminum film to a thickness of about 3,400 angstroms to provide a palladium-aluminum-palladium sandwich 11 constituting the destruction by eutectic reaction film on the substrate. These three sandwich films are vacuum deposited through a metal mask to provide a conductor path as shown particularly in FIG. 2 in dotted lines providing the portions 20 and 21 to reverse the direction of the thin film conducting sandwich film. Completely overlaying the sandwiched destructive films 12, 13, and 14 is a film of silicon monoxide 15 except for the terminal ends of the destruct film 11. The silicon monoxide film 15 is vacuum deposited over the lower sandwiched film and provides an electrical insulation film over the destructive palladium-aluminum-palladium sandwich. A nichrome resistor film 16 is vacuum deposited through a metal mask on top of the silicon monoxide insulating film to provide a resistance path shown broadly in FIG. 2 and more specifically in FIG. 3. The nichrome resistor film is deposited through the metal mask and etched or photo-etched to provide a path width of about 0.004 inch which lies over the sandwich destruct film 11 conductor path which is about 0.030 inch wide. The terminal ends of the resistor film 16 terminates in pads 17 while the terminal ends of the palladium-aluminum-palladium destructive film terminates in the pads 18. A chromium-gold mixture is thin film deposited through metal mask means onto the pad areas 17 and 18 to provide terminal points to which Kovar or other conductors may be soldered or welded to provide circuit inputs and outputs. The resistor film 16 has reverse turns 23 overlying the reverse turns 21 of the destruct film and the reverse turn 22 overlying reverse turn 20 of the destruct film 11 to produce complete destruction of the strategic or important parts of the resistor film when destruction is desired.

Figure 4:
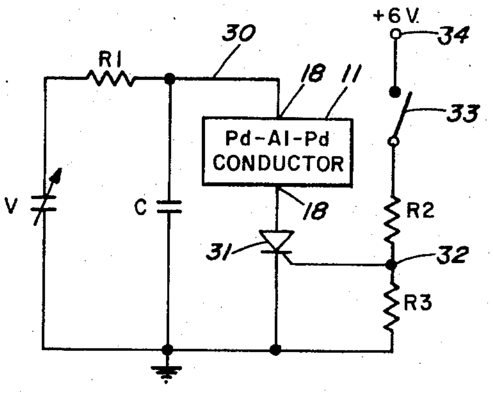
FIG. 4 is a circuit schematic partly in block of the pulse voltage source applied to the destructive conductor flim.

Referring more particularly to FIG. 4 terminals 18 of the palladium-aluminum-palladium conductor are connected in a pulsing circuit including a variable voltage source V in parallel across a capacitor C through a resistor R1. The variable voltage V may be about 200 to 300 volts and the capacitor about 30 microfarads. The upper plate of the capacitor C is coupled to conductor terminal 18 while the opposite plate or the lower plate of the capacitor C is connected to the common terminal of the voltage source V which may be ground. The other terminal 18 of the palladium-aluminum-palladium conductor circuit is coupled to the anode of a silicon controlled rectifier 31, the cathode of which is coupled to the common terminal or ground. The gate terminal of the silicon controlled rectifier 31 is coupled to the junction point 32 of resistors R2 and R3 in series through a switch 33 to a direct current voltage source, such as a 6 volt source, which may be coupled to the terminal 34. The other lead of the resistance R3 is coupled to the common lead or ground. Capacitor C will charge up to the voltage supplied by the source V and whenever the switch 33 is closed the rectifier 31 will be gated to conduct placing 200 volts directly across the destruct film 11 on the substrate 10 which will cause complete deterioration or destruction of the nichrome resistor film beyond recognition and reconstruction. Such action of destruction may be desirable whenever it appears that equipment with a plurality of such circuits on substrates may fall into enemy hands.

FIGURE 5

While the method of producing the thin film nichrome electronic circuit was described generally hereinabove in the description of the article, a particular method or steps of the method are provided herein to properly produce the microelectronic thin film module. Starting with the glass or ceramic substrate the step-by-step fabrication of the anticompromise circuit is produced by using thin film deposition techniques of both additive and subtractive measures. These steps will be listed below for convenience in following the method of producing the anti-compromise module.

ANTI-COMPROMISE CIRCUITRY

STEP 1

Vacuum deposit palladium through a stainless steel mask consisting of a pattern of vertical strips to a depth of 3,400 angstroms, as more clearly shown in the top view of FIG. 5.

STEP 2 a. Vacuum deposit aluminum through the same mask as used in STEP 1 to a depth of approximately 7,000 angstroms.

b. A second layer of aluminum is then vacuum deposited through another mask to a depth of 3,400 angstroms that joins a pad area 18 to the aluminum strips deposited in STEP 2.a. The pads serve as areas for bonding external leads to the anti-compromise circuitry. This pad area is shown in the second illustration beside STEP 2.b. in the drawing.

STEP 3

A second layer of palladium is deposited to a depth of about 3,400 angstroms through the vertical strip mask used in STEPS 1 and 2.a. to achieve a sandwiching effect of aluminum between palladium, as illustrated in the first two top views of FIG. 5 beside the STEPS 1, 2.a., and 3 and STEP 2.b.

INSULATIVE LAYER

STEP 4

The anti-compromise circuitry, with the exception of the aluminum pad 18 is then covered with silicon monoxide vacuum deposited through a metal mask as shown at the side of STEP 4 in FIG. 5.

OPERATIVE CIRCUITRY

STEP 5

Nichrome is deposited to a resistance of approximately 200 ohms per square inch through a metal mask over the silicon monoxide layer, as illustrated beside STEP 5 in FIG. 5.

STEP 6

The resistor pattern is etched or photo-etched from the nichrome film, as shown at the side of STEP 6 in FIG. 5.

STEP 7

The aluminum and nichrome pad areas 17 and 18 are covered by chromium-gold deposited through a metal mask, as shown at the side of STEP 7 in FIG. 5.

STEP 8

Finally, leads of Kovar or gold wire are attached to the gold pad areas 17 and 18 by soldering or parallel gap welding.

These method steps using the masks as shown in FIG. 5 provide a module capable of establishing a nichrome electronic circuit that is destructible by the palladium-aluminum-palladium sandwich film 11 whenever it is desirable to do so.

While many changes may be made in the structural conture of the microelectronic thin film circuit and the destructive circuit to provide desirable circuit conditions, the method of producing such modules should not be departed from and we desire to be limited in the spirit of making and producing such modules only by the scope of the appended claims.

We claim:

1. An anti-compromise thin film circuit module comprising:

an insulative material substrate for thin film circuitry;

a destructive film sandwich of aluminum thin film in between thin film layers of palladium vacuum deposited on said substrate;

an electrical insulating thin film vacuum deposited on said destructive film;

a thin film circuit vacuum deposited on said insulating film; and a switched voltage pulsed circuit coupled across said destructive film sandwich whereby switch closing of said voltage pulsed circuit will produce a eutectic reaction which will destroy said insulating film and thin film circuit beyond recognition or use.

2. An anti-compromise thin film circuit module as set forth in claim 1 wherein said destructive thin film sandwich has an etched circuit pattern to lie under strategic thin film circuit portions, the aluminum thin film being approximately equal by volume with the two outer sandwich thin film layers of palladium.

3. An anti-compromise thin film circuit module as set forth in claim 2 wherein
said aluminum thin film layer is approximately 7,000 angstroms thick and each of said two palladium thin layers are approximately 3,400 angstroms thick.

4. An anti-compromise thin film circuit module as set forth in claim 3 wherein
said thin film circuit is etched into the desired circuit pattern overlying said destructive film sandwich pattern, said thin film circuit being of nichrome.

5. An anti-compromise thin film circuit module as set forth in claim 4 wherein
said insulating thin film is silicon monoxide.

6. A method of producing an anti-compromise thin film circuit module comprising:
vacuum depositing a first thin film of palladium through a stainless steel mask of parallel strips on a face of electrical insulating substrate material;
vacuum depositing a thin film of aluminum through said stainless steel mask onto said first thin film of palladium;
vacuum depositing a second thin film of palladium through said stainless steel mask to achieve a sandwich of destructive thin films of said substrate;
vacuum depositing a thin film of electrical insulating material over said destructive thin film sandwich through a metal mask;
vacuum depositing a thin film of nichrome through a metal mask over said insulating film and photo-etching a circuit pattern therein;
vacuum depositing aluminum and nichrome connector pads to said aluminum and nichrome thin film layers through metal masks, respectively; and
vacuum depositing leads of Kovar and gold wire to said pads adapted for connecting a pulsed voltage to said aluminum of said destructive film and a circuit to said nichrome film whereby a destructive thin film circuit module is produced.

7. A method of producing an anti-compromise thin film circuit module as set forth in claim 6 wherein
said vacuum depositing of said first and third layers of palladium is continued until said layers are each about 3,400 angstroms thick and said vacuum depositing of said aluminum layer is continued until said aluminum layer is about 7,000 angstroms thick.

8. A method of producing an anti-compromise thin film circuit module as set forth in claim 7 wherein
said vacuum depositing of said aluminum and nichrome includes vacuum depositing connector pads thereto, respectively, and vacuum depositing chromium-gold over said pads to provide durable connection area.

9. A method of producing an anti-compromise thin film circuit module as set forth in claim 8 wherein
said vacuum depositing of said nichrome is continued until the resistance thereof reaches approximately 200 ohms per square inch.

* * * * *